United States Patent
Li et al.

(10) Patent No.: US 12,369,401 B2
(45) Date of Patent: Jul. 22, 2025

(54) ARRAY SUBSTRATE HAVING AN ACTIVE LAYER STRUCTURE WITH TWO LAYERS IN PARALLEL AND DISPLAY PANEL HAVING AN ACTIVE LAYER STRUCTURE WITH TWO LAYERS IN PARALLEL

(71) Applicant: WUHAN CHINA STAR OPTOELECTRONICS TECHNOLOGY CO., LTD., Wuhan (CN)

(72) Inventors: Zhifu Li, Wuhan (CN); Guanghui Liu, Wuhan (CN); Fei Ai, Wuhan (CN); Dewei Song, Wuhan (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/998,999

(22) PCT Filed: Nov. 7, 2022

(86) PCT No.: PCT/CN2022/130242
§ 371 (c)(1),
(2) Date: Nov. 16, 2022

(87) PCT Pub. No.: WO2024/036766
PCT Pub. Date: Feb. 22, 2024

(65) Prior Publication Data
US 2024/0222379 A1    Jul. 4, 2024

(30) Foreign Application Priority Data

Aug. 16, 2022 (CN) .......................... 202210982131.9

(51) Int. Cl.
*H10D 86/60* (2025.01)
*H10D 86/40* (2025.01)

(52) U.S. Cl.
CPC ........... *H10D 86/60* (2025.01); *H10D 86/421* (2025.01)

(58) Field of Classification Search
CPC .............................. H10D 86/60; H10D 86/421
(Continued)

(56) References Cited

U.S. PATENT DOCUMENTS 8,842,231 B2 *   9/2014   Liu .................... H10D 86/441
                                                        349/46
2013/0240886 A1   9/2013   Yeh
(Continued)

FOREIGN PATENT DOCUMENTS

CN    102184968 A    9/2011
CN    106409845 A    2/2017
(Continued)

OTHER PUBLICATIONS

International Search Report in International application No. PCT/CN2022/130242, mailed on Feb. 22, 2023.
(Continued)

*Primary Examiner* — Quoc D Hoang

(57) ABSTRACT

Embodiments of the present disclosure provide an array substrate and a display panel. The array substrate includes a first active layer, a gate electrode, a gate insulating layer, a second active layer, and a source/drain metal layer. The first active layer is connected in parallel with the second active layer through a conductor layer. Through an active layer structure with two layers in parallel, an on-state current and mobility of equivalent carriers of a device are effectively improved, and a comprehensive performance of the device is improved.

20 Claims, 7 Drawing Sheets

(58) Field of Classification Search
USPC .......................................................... 257/72
See application file for complete search history.

(56) References Cited

U.S. PATENT DOCUMENTS

| | | | |
|---|---|---|---|
| 2016/0211276 A1* | 7/2016 | Liu | ...................... H10D 86/215 |
| 2018/0151633 A1 | 5/2018 | Won et al. | |
| 2021/0074702 A1* | 3/2021 | Le | ...................... H01L 27/0883 |

FOREIGN PATENT DOCUMENTS

| | | |
|---|---|---|
| CN | 107154407 A | 9/2017 |
| CN | 111244128 A | 6/2020 |
| CN | 111668237 A | 9/2020 |
| CN | 113113425 A | 7/2021 |
| CN | 114743994 A | 7/2022 |

OTHER PUBLICATIONS

Written Opinion of the International Search Authority in International application No. PCT/CN2022/130242, mailed on Feb. 22, 2023.

Chinese Office Action issued in corresponding Chinese Patent Application No. 202210982131.9 dated Apr. 30, 2025, pp. 1-7.

* cited by examiner

ARRAY SUBSTRATE HAVING AN ACTIVE LAYER STRUCTURE WITH TWO LAYERS IN PARALLEL AND DISPLAY PANEL HAVING AN ACTIVE LAYER STRUCTURE WITH TWO LAYERS IN PARALLEL

FIELD OF INVENTION

The present disclosure relates to a technical field of display panel manufacturing, and particularly relates to an array substrate and a display panel.

BACKGROUND OF INVENTION

With development of display panel manufacturing technologies, people have put forward higher requirements on display effect and comprehensive performance of display panels and display devices.

In display panels, low temperature polycrystalline silicon thin film transistors are key components in active driving and peripheral circuits in display devices such as liquid crystal displays (LCDs) and organic light emitting diodes (OLEDs). In order to improve the performance of the thin film transistors, in prior art, structures such as lightly doped drains and raised source-drain are usually formed inside the thin film transistors, and stability and reliability of thin film transistor devices are improved by the lightly doped drains and raised source-drain structures. Therefore, the devices prepared by the above-mentioned structures can improve the performance of the thin film transistors to a certain extent. However, the above-mentioned structures will additionally introduce a new series resistance structure, the series resistance structure is likely to reduce an on-state current and mobility of equivalent carriers inside the thin film transistors, thereby affecting the performance of the thin film transistors, which is not conducive to the further improvements of a comprehensive performance of the thin film transistor.

Therefore, it is necessary to propose solutions to problems in the prior art.

Technical Problems

In summary, in the display panels in the prior art, an on-state current and mobility of equivalent carriers of thin film transistors inside display panels are relatively low, which is not conducive to further improvement of comprehensive performance of the display panels.

Technical Solutions

To solve the above problems, embodiments of the present disclosure provide an array substrate and a display panel to effectively improve an on-state current and a mobility of the equivalent carriers in a thin film transistor inside the display panel, and to improve a comprehensive performance of a device.

In order to solve above technical problems, the present disclosure provides an array substrate and a display panel. The array substrate includes:
  a substrate;
  a first active layer, disposed on the substrate, the first active layer comprising a first channel area and first doped areas located at two sides of the first channel;
  a gate electrode, disposed on the first active layer;
  a gate insulating layer, disposed on the first active layer and covering the gate electrode;
  a second active layer, disposed on the gate insulating layer, the second active layer comprising a second channel area and second doped areas located at two sides of the second channel area; and
  a source/drain metal layer, disposed on the second active layer;
  wherein the first doped areas are arranged corresponding to the second doped areas, the source/drain metal layer is electrically connected with the second doped areas, and parts of the first active layer in the first doped areas are correspondingly and electrically connected with parts of the second active layer in the second doped areas;
  wherein a length of the first active layer is greater than or equal to a length of the second active layer.

According to an embodiment of the present disclosure, a length of an orthographic projection of each of the second doped areas on the substrate is greater than a length of an orthographic projection of each of the first doped areas on the substrate.

According to an embodiment of the present disclosure, the first doped areas and the second doped areas all comprise heavily doped areas and lightly doped areas, the lightly doped areas and the heavily doped areas are adjacent, and the heavily doped areas are disposed away from channel areas;
  wherein the heavily doped areas of the first active layer correspond to the heavily doped areas of the second active layer, the lightly doped areas of the first active layer correspond to the lightly doped areas of the second active layer, and the source/drain metal layer is electrically connected with parts of the second active layer corresponding to the heavily doped areas.

According to a second aspect of the embodiments of the present disclosure, an array substrate is also provided, the array substrate includes:
  a substrate;
  a first active layer, disposed on the substrate, the first active layer comprising a first channel area and first doped areas located at two sides of the first channel;
  a gate electrode, disposed on the first active layer;
  a gate insulating layer, disposed on the first active layer and covering the gate electrode;
  a second active layer, disposed on the gate insulating layer, the second active layer comprising a second channel area and second doped areas located at two sides of the second channel area; and
  a source/drain metal layer, disposed on the second active layer;
  wherein the first doped areas are arranged corresponding to the second doped areas, the source/drain metal layer is electrically connected with the second doped areas, and parts of the first active layer in the first doped areas are correspondingly and electrically connected with parts of the second active layer in the second doped areas.

According to an embodiment of the present disclosure, a length of an orthographic projection of each of the second doped areas on the substrate is greater than a length of an orthographic projection of each of the first doped areas on the substrate.

According to an embodiment of the present disclosure, the first doped areas and the second doped areas all comprise heavily doped areas and lightly doped areas, the lightly doped areas and the heavily doped areas are adjacent, and the heavily doped areas are disposed away from channel areas;

wherein the heavily doped areas of the first active layer correspond to the heavily doped areas of the second active layer, the lightly doped areas of the first active layer correspond to the lightly doped areas of the second active layer, and the source/drain metal layer is electrically connected with parts of the second active layer corresponding to the heavily doped areas.

According to an embodiment of the present disclosure, the array substrate further comprises a first via hole and a second via hole, the heavily doped areas of the first active layer are connected with the heavily doped areas of the second active layer through the first via hole and the second via hole.

According to an embodiment of the present disclosure, the array substrate further comprises a conductor layer, the conductor layer is disposed in the first via hole and the second via hole, and the first active layer is connected in parallel with the second active layer through the conductor layer.

According to an embodiment of the present disclosure, a material of the conductor layer is same as a material of the parts of the second active layer corresponding to the heavily doped areas.

According to an embodiment of the present disclosure, the array substrate further comprises a third via hole and a fourth via hole, the source/drain metal layer is disposed on surfaces of the heavily doped areas of the second active layer, and the source/drain metal layer is electrically connected with the heavily doped areas of the first active layer through the third via hole and the fourth via hole.

According to an embodiment of the present disclosure, the third via hole and the fourth via hole pass through the heavily doped areas of the second active layer.

According to an embodiment of the present disclosure, the source/drain metal layer is disposed on upper surfaces of the heavily doped areas of the second active layer, and the source/drain metal layer is electrically connected with the second active layer and is electrically connected with the first active layer through corresponding via holes.

According to an embodiment of the present disclosure, the array substrate further comprises a connection metal layer, and the connection metal layer is disposed in corresponding film layers between the first active layer and the second active layer.

According to an embodiment of the present disclosure, the connection metal layer and the gate electrode are disposed in a same layer, and the connection metal layer is electrically connected to the source/drain metal layer and the heavily doped areas of the first active layer.

According to an embodiment of the present disclosure, a material of the connection metal layer is same as a material of the gate electrode.

According to an embodiment of the present disclosure, a length of each of the lightly doped areas of the first active layer is less than a length of each of the lightly doped areas of the second active layer.

According to an embodiment of the present disclosure, the first channel area and the second channel area are disposed corresponding to the gate electrode.

According to an embodiment of the present disclosure, an orthographic projection of the second channel area on the substrate is within an orthographic projection of the first channel area on the substrate.

According to an embodiment of the present disclosure, the array substrate further comprises a light shielding layer, the light shielding layer is disposed on the substrate, and the first active layer is disposed on the light shielding layer.

According to an embodiment of the present disclosure, an orthographic projection of the first channel area of the first active layer on the substrate is with an orthographic projection of the light shielding layer on the substrate.

According to a third aspect of the embodiments of the present disclosure, there is also provided a display panel, comprising:
an array substrate; and
a pixel expression layer, disposed on the array substrate;
wherein at least two active layers are arranged in the array substrate, the active layers are connected in parallel, and the array substrate is the array substrate provided in the embodiments of the present disclosure.

Beneficial Effects

In summary, beneficial effects of the embodiments of the present disclosure are as followings.

Embodiments of the present disclosure provide an array substrate and a display panel. The array substrate includes a first active layer, a gate electrode, a gate insulating layer, a second active layer, and a source/drain metal layer, wherein the array substrate further includes a conductor layer, the conductor layer is arranged between the first active layer and the second active layer, and the first active layer is connected in parallel with the second active layer through the conductor layer. In the embodiments of the present disclosure, the on-state current and mobility of the equivalent carriers of the thin film transistor are effectively improved by setting an active layer structure with two layers in parallel. At the same time, in the embodiments of the present disclosure, the active layer structure with two layers in parallel is arranged vertically, which effectively reduces a layout area of the active layers and further improves the comprehensive performance of the array substrate.

DETAILED DESCRIPTION OF EMBODIMENTS

The following descriptions of various embodiments refer to the accompanying drawings to illustrate specific embodiments in which the present disclosure may be practiced.

With development of display panel manufacturing technologies, people have put forward higher requirements on performance and display effect of display panels and display devices.

The performance of the display devices is closely related to performance of its internal devices. In the prior art, when preparing thin film transistor devices in the display panels, the performance of the obtained thin film transistors is usually unsatisfactory, such as on-state current and mobility of equivalent carriers of the prepared thin film transistors being unsatisfactory, thereby reducing quality and effect of the devices, and being not conducive to improvement of comprehensive performance of the display devices.

The embodiments of the present disclosure provide an array substrate and a display panel to effectively improve comprehensive performance of the display panel.

Figure 1:
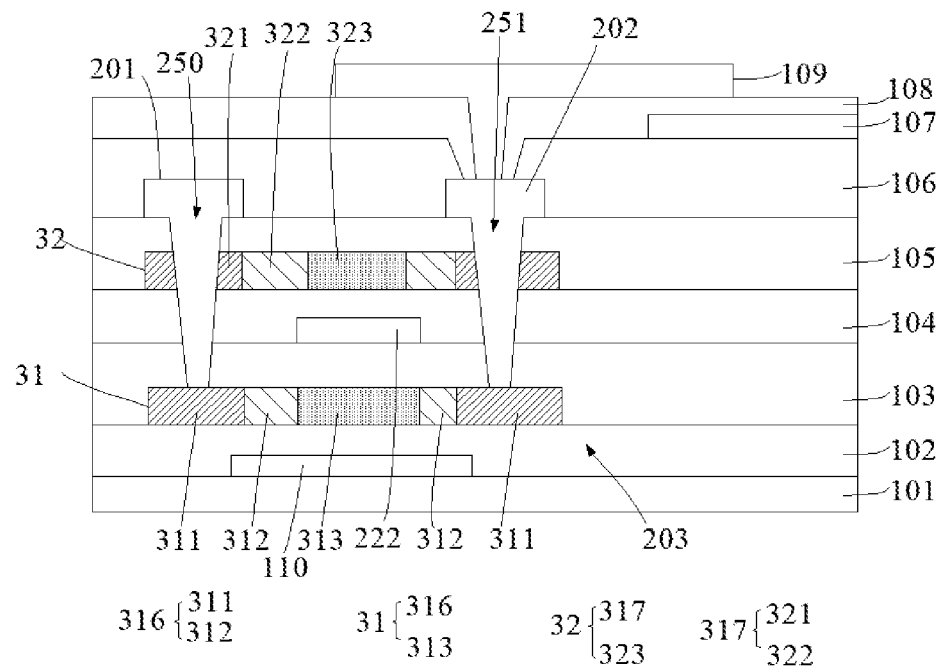
FIG. 1 is a schematic diagram of a film structure of a first array substrate provided in an embodiment of the present disclosure.

As shown in FIG. 1, FIG. 1 is a schematic diagram of a film structure of a first array substrate provided in an embodiment of the present disclosure. Specifically, the display panel includes a substrate 101, a light shielding layer 110, a buffer layer 102, a first active layer 31, a first gate insulating layer 103, a gate electrode 222, a second gate insulating layer 104, a second active layer 32, an interlayer insulating layer 105, a source electrode 201, and a drain electrode 202.

Specifically, the light shielding layer 110 is disposed on the substrate 101, At a same time, the buffer layer 102 is disposed on the substrate 101 and covers the light shielding layer 110 completely. The first active layer 31 is disposed on the buffer layer 102, the first gate insulating layer 103 is disposed on the first active layer 31 and covers the first active layer 31 completely at the same time.

At the same time, the gate electrode 222 is disposed on the first gate insulating layer 103, the second gate insulating layer 104 is disposed on the first gate insulating layer 103, and the second gate insulating layer 104 covers the gate electrode 222 completely. The second active layer 32 is disposed on the second gate insulating layer 104, the interlayer insulating layer 105 is disposed on the second gate insulating layer 104, and the interlayer insulating layer 105 covers the second active layer 32 completely.

In the embodiment of the present disclosure, the source electrode 201 and the drain electrode 202 are disposed on the interlayer insulating layer 105. In the embodiment of the present disclosure, a source/drain metal layer corresponds to the source electrode 201 and the drain electrode 202, respectively. Specifically, the source electrode 201 and the drain electrode 202 are disposed at positions corresponding to the first active layer 31 and the second active layer 32, and the source electrode 201 and the drain electrode 202 are electrically connected to the second active layer 32 at least through corresponding via holes.

Furthermore, the array substrate further includes a planarization layer 106. The planarization layer 106 is disposed on the interlayer insulating layer 105, and the planarization layer 106 completely covers the source electrode 201 and the drain electrode 202. Also, a first electrode layer 107 and a passivation layer 108 are disposed on the planarization layer 106. The first electrode layer 107 is disposed on the planarization layer 106, and the passivation layer 108 completely covers the first electrode layer 107, wherein the first electrode layer 107 may be a first pixel electrode.

At the same time, the array substrate further includes a second electrode layer 109. The second electrode layer 109 is disposed on the passivation layer 108, and the second electrode layer 109 is electrically connected to the drain electrode 202 through corresponding via holes, wherein, the second electrode layer 109 may be a second pixel electrode.

In the embodiment of the present disclosure, in the array substrate, the first active layer 31, the gate electrode 222, the second active layer 32, the source electrode 201, the drain electrode 202, and corresponding interlayer dielectric layers form a thin film transistor 203. Driving and controlling signals are provided to the display device through the thin film transistor 203. At the same time, the thin film transistor 203 includes the first active layer 31 and the second active layer 32, and the first active layer 31 and the second active layer 32 are in a parallel structure, thereby effectively improving the performance such as the on-state current of the thin film transistor 203.

In following specific embodiments, the thin film transistor 203 is formed by at least two active layers connected in parallel, and the active layers are described by taking the first active layer 31 and the second active layer 32 as examples. The two active layers are arranged in a stacked structure between the film layers, for example, orthographic projections of the active layers on the substrate correspond to each other or are located in a same area.

Preferably, the orthographic projection of the second active layer 32 on the substrate is located in an area corresponding to the orthographic projection of the first active layer 31 on the substrate. For example, the orthographic projections of the two may be completely coincident. Alternatively, the orthographic projection of the second active layer is located within an area of the orthographic projection of the first active layer. When the orthographic projection of the first active layer 31 completely coincides with the orthographic projection of the second active layer 32, the second active layer 32 is disposed directly above the first active layer 31, thereby effectively saving a layout space of different active layers in the array substrate, so as to improve the performance of the device.

Furthermore, in the embodiment of the present disclosure, the first active layer 31 includes first doped areas 316 and a first channel area 313, and the first doped areas 316 are correspondingly disposed on both sides of the first channel area 313. The second active layer 32 includes second doped areas 317 and a second channel area 323. The second doped areas 317 are correspondingly disposed on both sides of the second channel area 323. Wherein the first doped areas 316 and the second doped areas 317 are arranged correspondingly, and the first channel area 313 and the second channel area 323 are arranged correspondingly. Preferably, the second doped areas 317 are disposed directly above the first doped areas 316, and the second channel area 323 is disposed directly above the first channel area 313.

Wherein a length of an orthographic projection of the second doped area 317 on the substrate is greater than a length of an orthographic projection of the first doped area 316 on the substrate.

In the embodiments of the present disclosure, the first doped areas 316 of the first active layer 31 and the second doped areas 317 of the second active layer 32 may be doped areas of active layers. In following embodiments, the first doped areas 316 and the second doped areas 317 are both described by taking the doped areas as examples.

Specifically, in the first active layer 31, the first doped areas 316 includes a lightly doped area 312 and a heavy doped area 311 of the first active layer 31. The lightly doped area 312 is disposed adjacent to the heavily doped area 311, and the lightly doped area 312 is disposed on a side adjacent to the first channel area 313. Preferably, the lightly doped areas 312 and the heavily doped areas 311 of the first active layer 31 are symmetrically arranged relative to the first channel area 313.

At the same time, in the second active layer 32, the second doped areas 317 includes a lightly doped area 322 and a heavily doped area 321 of the second active layer 32. The lightly doped area 322 is disposed adjacent to the heavily doped area 321, and the lightly doped area 322 is disposed on a side adjacent to the second channel area 323. Preferably, the lightly doped areas 322 and the heavily doped areas 321 are symmetrically arranged relative to the second channel area 323.

In the embodiment of the present disclosure, the lightly doped areas 312 of the first active layer 31 are set correspondingly to the lightly doped areas 322 of the second active layer 32. At the same time, the heavily doped areas 311 of the first active layer 31 and the heavily doped areas 321 of the second active layer 32 are disposed correspondingly. Preferably, they are all arranged at positions above corresponding areas.

Wherein the source/drain metal layer is disposed at a position corresponding to the second doped areas 317, and is electrically connected to the second active layer 32. Specifically, the source electrode 201 is provided at a position above the heavily doped area 321 of the second doped area 317, and the drain electrode 202 is provided at a position above the heavily doped area 321 of the second doped area 317 of another side.

Specifically, the array substrate further includes a first via hole 250 and a second via hole 251. The first via hole 250 and the second via hole 251 are defined above the doped areas of the first active layer 31, and the first via hole 250 and the second via hole 251 penetrate through the second active layer 32, and via structures are formed in the doped areas 321 of the second active layer 32.

In the embodiment of the present disclosure, the source/drain metal layer is electrically connected to the first active layer 31 and the second active layer 32 through the first via hole 250 and the second via hole 251. Thus, the first active layer 31 and the second active layer 32 form a parallel structure.

Figure 14:
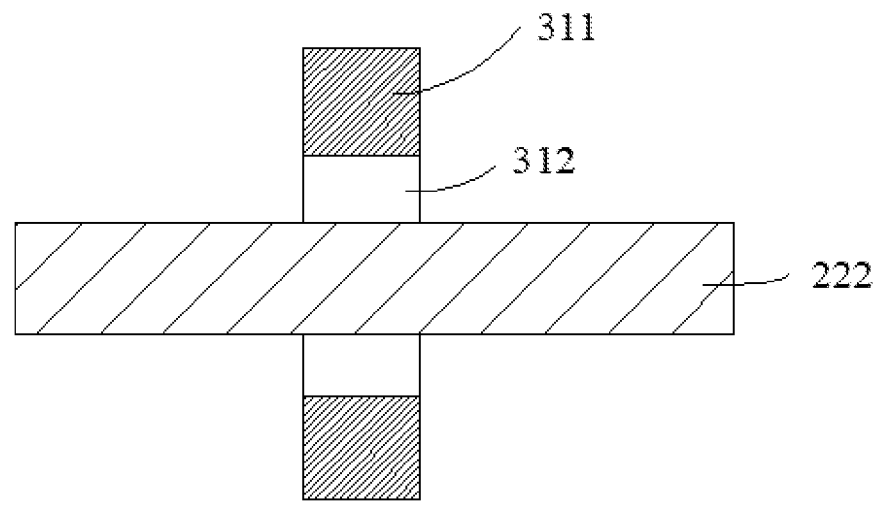
FIG. 14 is a simplified schematic plan view corresponding to a part of the film structure in the array substrate provided in FIG. 1.
Figure 15:
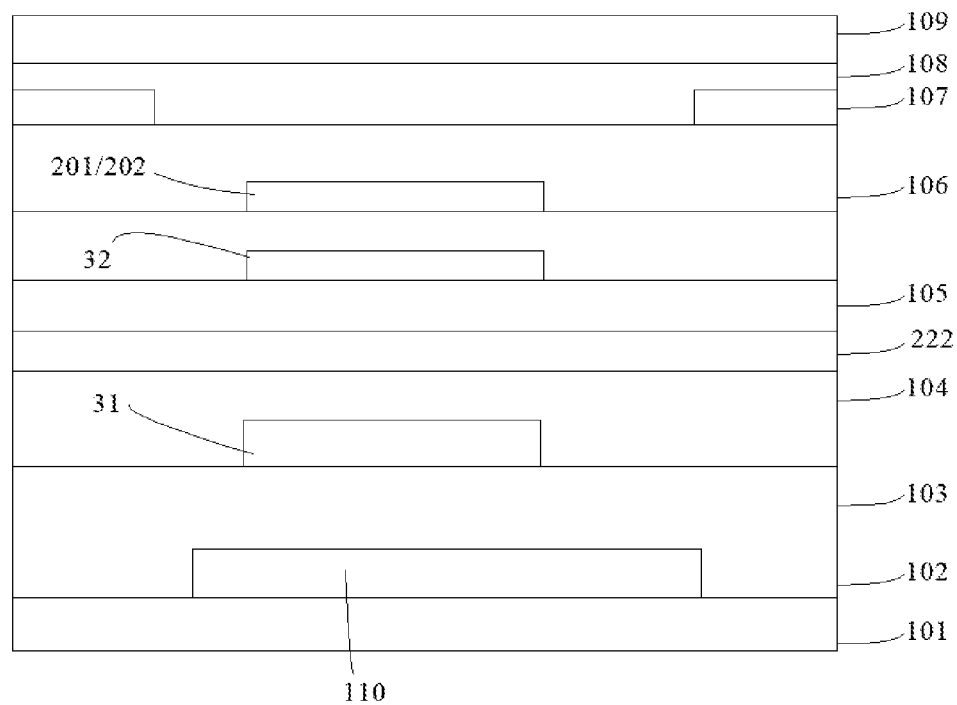
FIG. 15 is a side view of the array substrate provided in FIG. 1.

Furthermore, as shown in FIG. 14 and FIG. 15, FIG. 14 is a simplified schematic plan view corresponding to a part of the film structure in the array substrate provided in FIG. 1, and FIG. 15 is a side view of the array substrate provided in FIG. 1. Referring to FIG. 14 for details, the gate electrode 222 of the thin film transistor is disposed on the first active layer. Specifically, the first active layer includes heavily doped areas 311, lightly doped areas 312, and a channel area 313. At the same time, the gate electrode 222 is correspondingly disposed above the channel area 313. Referring to FIG. 15, when the first active layer 31, the second active layer 32, and the light shielding layer 110 are disposed, the three layers may be located in a same vertical direction.

Figure 2:
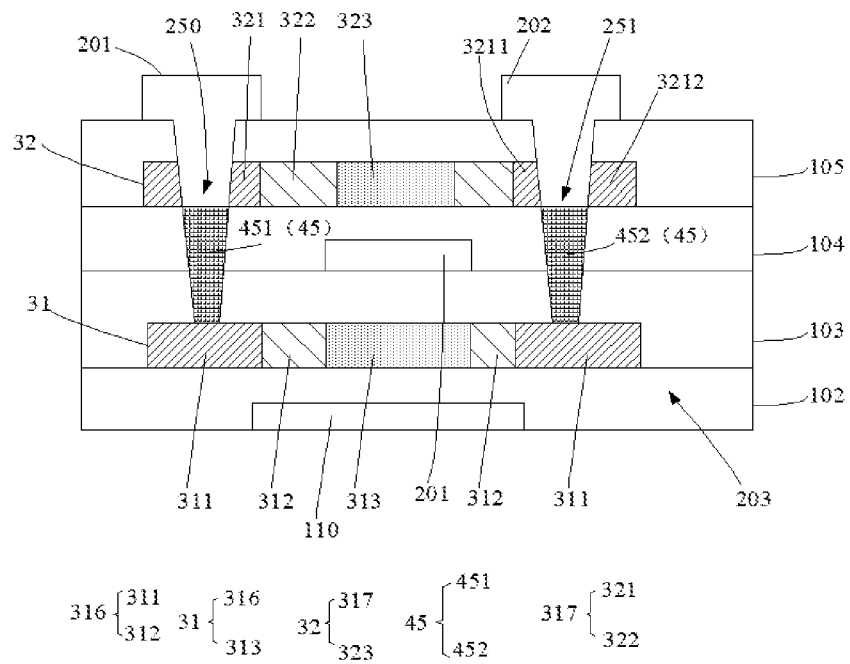
FIG. 2 is a schematic diagram of a film structure of a second array substrate provided in an embodiment of the present disclosure.

Specifically, referring to FIG. 2, FIG. 2 is a schematic diagram of a film structure of a second array substrate provided in an embodiment of the present disclosure.

In the embodiment of the present disclosure, the array substrate is further provided with a conductor layer 45. The conductor layer 45 is disposed in corresponding film layers between the first active layer 31 and the second active layer 32, and the first active layer 31 is connected to the second active layer 32 through the conductor layer 45, thus the first active layer 31 and the second active layer 32 form the parallel structure.

Specifically, in the embodiment of the present disclosure, the conductor layer 45 is described by taking a first conductor layer 451 and a second conductor layer 452 as examples. The first conductor layer 451 and the second conductor layer 452 are respectively disposed in areas between the heavily doped areas 311 of the first active layer 31 and the heavily doped areas 321 of the second active layer 32. At the same time, one end of the first conductor layer 451 is electrically connected to the heavily doped area 311 of the first active layer 31, and another end of the first conductor layer 451 is electrically connected to the heavily doped area 311 of the second active layer 32 correspondingly. Moreover, two ends of the second conductor layer 452 are correspondingly and electrically connected to the heavily doped areas of another side of the active layers.

Preferably, in the embodiment of the present disclosure, when the conductor layer is electrically connected to the second active layer 32, they may be connected by direct contact. That is, the conductor layer is directly disposed at positions of the heavily doped areas of the second active layer 32, and via holes are defined by etching in other film layers, and then electrically connected to a lower first active layer 31.

At the same time, the conductor layer 45 may also be directly disposed in the first via hole and the second via hole. Preferably, the first conductor layer 451 is disposed in the first via hole 250, and the second conductor layer 452 is disposed in the second via hole 251. Wherein, when forming the first via hole 250 and the second via hole 251, they may be fabricated through one etching process, and the conductor layer may be directly filled in the via holes, thereby effectively simplifying preparation process and improving the performance of the device.

In the embodiment of the present disclosure, the first via hole 250 and the second via hole 251 may be symmetrically arranged with respect to the second channel area 323. Preferably, the first via hole 250 and the second via hole 251 are respectively arranged at middle positions of the heavily doped areas 321.

Furthermore, in the embodiment of the present disclosure, when the first via hole 250 and the second via hole 251 penetrate the first active layer 31, corresponding one of the heavily doped areas is divided into two parts, such as a first part 3211 and a second part 3212 on another side. In the embodiment of the present disclosure, a doping concentration corresponding to the first portion 3211 and a doping concentration in the second portion 3212 may be different, for example, an ion doping concentration in the outer second portion 3212 is greater than an ion doping concentration in the first portion 3211, so as to form different concentration differences to further improve the mobility of equivalent carriers inside the device.

Preferably, another concentration difference may be formed between the first part 3211 and the lightly doped areas, and the ion concentration in the first part 3211 is greater than an ion concentration in the lightly doped areas, so as to further improve the performance of the device. Performance, specifically, the concentration difference in different areas may be set according to actual products, which will not be described in detail here.

When the active layer 32 is defined with the first via hole 250 and the second via hole 251, a corresponding conductor layer may extend into the via holes and be electrically connected to the second active layer 32 through the via holes.

At the same time, a material of the first conductor layer 451 and a material of the second conductor layer 452 may be a same material, such as anyone of Ti, Al, Mo, and Ti/Al composite materials, or other metallic materials with good electrical properties. Furthermore, the material of the conductor layer may also be same as a material in the heavily doped areas of the first active layer 31. When the material of the conductor layer is the same as the material in the heavily doped areas of the first active layer 31, the material of the conductor layer is an N-type heavily doped material or a P-type heavily doped material.

Specifically, as shown in FIG. 1, in the embodiment of the present disclosure, the via holes corresponding to the source/drain metal layer are directly etched from the interlayer insulating layer 105 to corresponding positions of the first active layer 31. This way, the conductor layer is equivalent to parts of the source/drain metal layer, and the parallel structure of the first active layer 31 and the second active layer 32 is realized through the source/drain metal layer. Thus, technological processes of the thin film transistor are effectively simplified, and the comprehensive performance of the device is improved.

Furthermore, in the embodiment of the present disclosure, when the first active layer 31 and the second active layer 32 are provided, a length of the first active layer 31 may be greater than or equal to a length of the second active layer 32. That is, a length of an orthographic projection of the first active layer 31 on the substrate may be greater than or equal to a length of an orthographic projection of the second active layer 32 on the substrate.

At the same time, in order to ensure the performance of the thin film transistor, in the embodiment of the present disclosure, when the first active layer 31 and the second active layer 32 are provided, a length of the first channel area 313 of the first active layer 31 may be greater than a length of the channel area 323 of the second active layer 32. At the same time, a length of the lightly doped area 312 of the first active layer 31 may be less than a length of the lightly doped area 322 of the second active layer 32.

Preferably, the length of the first channel area 313 of the first active layer 31 is set to be 2.1 µm-3.1 µm, and a length of the second channel area 323 of the second active layer 32 is set to be 1.5 µm-2.5 µm. Correspondingly, the length of the first channel area 313 of the first active layer 31 may be 0.4 µm-1.6 µm longer than the length of the second channel area of the second active layer 32. For example, the length of the channel area 313 of the first active layer 31 is 0.6 µm longer than the length of the channel area of the second active layer 32.

At the same time, the length of the lightly doped area 322 on each side of the second active layer 32 is set to be 1.0 µm-2.0 µm. Preferably, a length of the lightly doped area 322 on one side of the second active layer 32 is set to 1.5 µm. Moreover, the length of the lightly doped area 312 on each side of the first active layer 31 is set to 0.7 µm-1.7 µm, preferably, the length of the lightly doped area 312 on one side of the first active layer 31 is set to 1.2 µm. At this time, the length of the lightly doped area 312 of the first active layer 31 is 0.3 µm shorter than the length of the lightly doped area 322 of the second active layer 32.

Furthermore, in the embodiment of the present disclosure, a length of the heavily doped area on each side of the first active layer 31 and the second active layer 32 is set to be between 2.5 µm-3.2 µm, such as set to 3 µm. In the embodiment of the present disclosure, by setting corresponding different functional areas in the first active layer 31 and the second active layer 32 to different parameters, it can prevent an upper active layer from being offset when different active layers are prepared and formed, which will affect performance of a lower active layer, thereby effectively improving the performance of the thin film transistor.

In the embodiment of the present disclosure, when the gate electrode 222 of the thin film transistor is provided, a length of the gate electrode 222 is not less than the length of the channel area of the first active layer 31, and at the same time, the length of the gate electrode 222 is not less than the length of the channel area of the second active layer 32.

Figure 3:
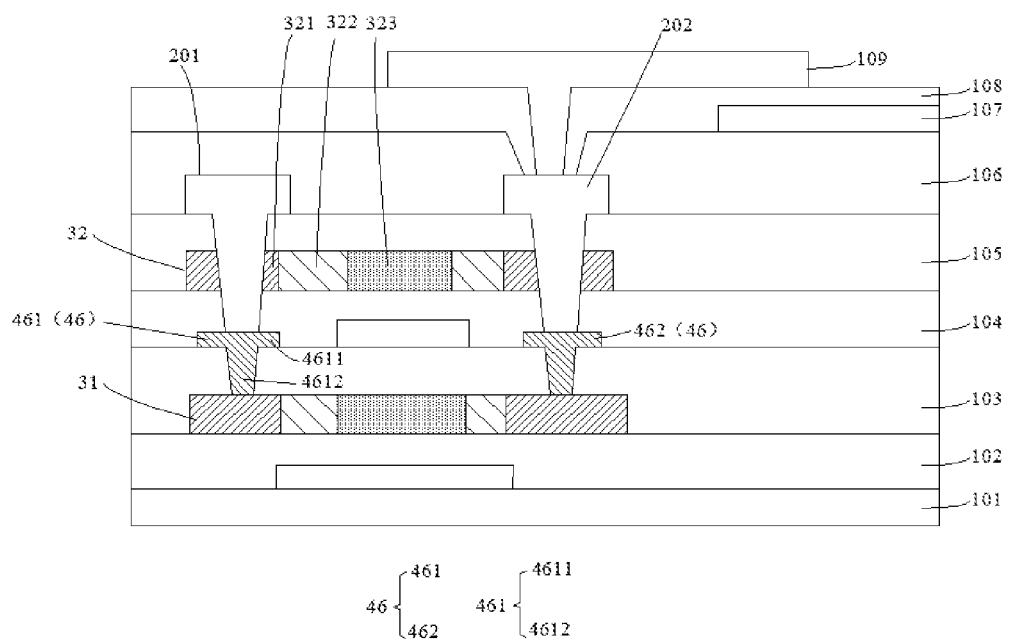
FIG. 3 is a schematic diagram of a film structure of a third array substrate provided in an embodiment of the present disclosure.

Furthermore, as shown in FIG. 3, FIG. 3 a schematic diagram of a film structure of a third array substrate provided in an embodiment of the present disclosure. At the same time, in combination with the film structures in FIG. 1 and FIG. 2, in the embodiment of the present disclosure, the array substrate may further include a connection metal layer 46. The connection metal layer 46 is disposed in corresponding film layers between the first active layer 31 and the second active layer 32. Wherein in following embodiments, the connection metal layer 46 is disposed on the first gate insulating layer 103, and the connection metal layer 46 and the gate electrode 222 are disposed in a same layer.

In the following embodiments, the connection metal layer 46 is described by taking a first connection metal layer 461 and a second connection metal layer 462 as examples. The first connection metal layer 461 and the second connection metal layer 462 are respectively disposed at corresponding positions of the heavily doped areas on both sides. In the embodiment of the present disclosure, the connection metal layer is equivalent to a transitional connection film layer of the conductor layer. By setting the connection metal layer, depths of the first via hole and the second via hole are reduced, thereby increasing a stability of the connection between the devices, and further improving the comprehensive performance of the thin film transistor.

Specifically, in the embodiment of the present disclosure, the heavily doped areas 321 of the second active layer 32 are respectively provided with a via structure. Through the via structure, the source electrode 201 and the drain electrode 202 of the thin film transistor are respectively and electrically connected to the corresponding connection metal layer. Wherein the source electrode 201 is electrically connected to the second active layer 32 through a via hole, and an end of the source electrode 201 is also electrically connected to the first connection metal layer 461. The drain electrode 202 is electrically connected to the second active layer 32 through another via hole, and at the same time, an end of the drain electrode 202 is also electrically connected to the second connection metal layer 462. Thus, a parallel connection between the first active layer 31 and the second active layer 32 is realized through the source/drain metal layer and the connection metal layer.

Preferably, the first connection metal layer 461 and the second connection metal layer 462 both includes an extension portion 4611 and a main body portion 4612. The extension portion 4611 is disposed at an edge of the main body portion 4612, such as a planar structure. A projection of the extension portion 4611 on the substrate is located in an orthographic projection of the heavily doped area 321 on the substrate, thereby guaranteeing the performance of the thin film transistor.

In the embodiment of the present disclosure, via holes corresponding to the connection metal layer may be arranged corresponding to the first via hole and the second via hole, so that the source/drain metal layer and the connection metal layer may be located in a same vertical plane, so as to reduce complexity of the preparation processes.

In this embodiment of the present disclosure, a material of the connection metal layer 46 may be same as a material of the gate electrode 222. During a preparation, the connection metal layer and the gate electrode are prepared in a same layer, thereby further simplifying the preparation processes of the device. For example, Mo metal or other metal materials with excellent electrical properties are used, which will not be described in detail here.

Figure 4:
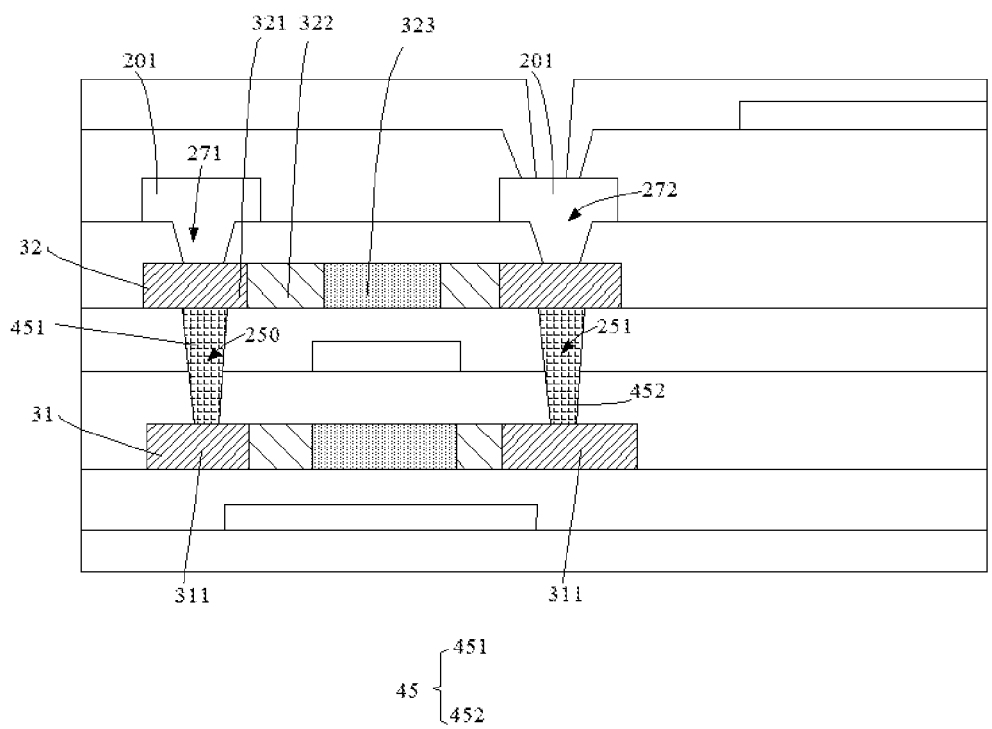
FIG. 4 is a schematic diagram of a film structure of a fourth array substrate provided in an embodiment of the present disclosure.

As shown in FIG. 4, FIG. 4 is a schematic diagram of a film structure of a fourth array substrate provided in an embodiment of the present disclosure. In the embodiment of the present disclosure, the first via hole 250 and the second via hole 251 are disposed between the first active layer 31 and the second active layer 32. The heavily doped areas 311 of the first active layer 31 are electrically connected to the heavily doped areas 321 of the second active layer 32.

Specifically, when connecting, materials in the first via hole 250 and the second via hole 251 may be same as a material of the heavily doped areas of the second active layer 32, for example, the material may be an N-type heavily doped material or a P-type heavily doped material.

Compared with deep via structures corresponding to the source/drain metal layer in FIG. 1, in the embodiment of the present disclosure, the first via hole 250 and the second via hole 251 are directly arranged between the first active layer 31 and the second active layer 32, thereby effectively reducing a depth of the via structure, simplifying fabrication processes, and effectively improving the stability of the connection.

Figure 5:
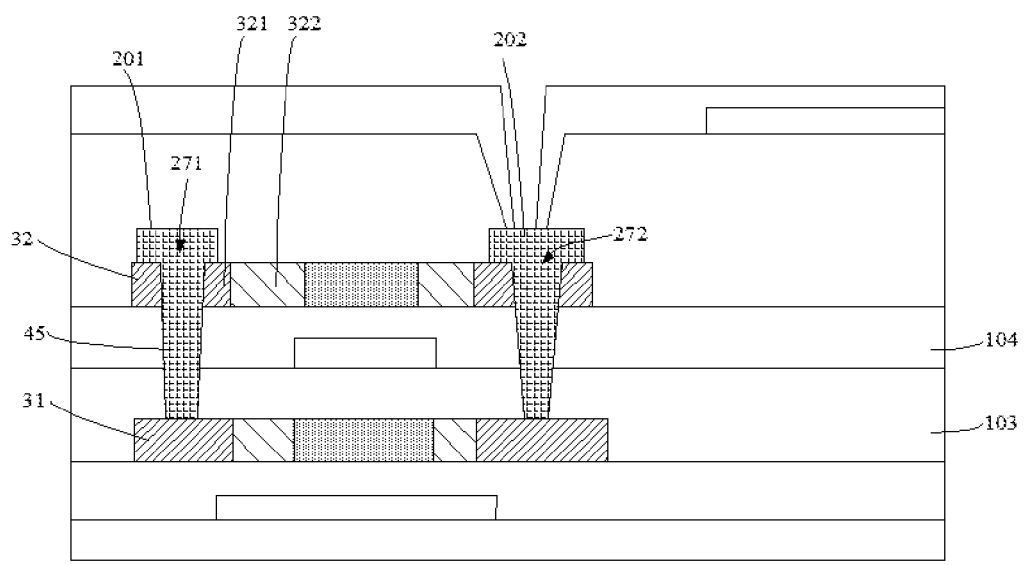
FIG. 5 is a schematic diagram of a film structure of a fifth array substrate provided in an embodiment of the present disclosure.

Preferably, as shown in FIG. 5, FIG. 5 is a schematic diagram of a film structure of a fifth array substrate provided in an embodiment of the present disclosure. At the same time, with reference to the film 32 structures in FIGS. 1-4, in the embodiment of the present disclosure, the array substrate is defined with a third via hole 271 and a fourth via hole 272. The third via hole 271 and the fourth via hole 272 are correspondingly disposed at corresponding positions of the heavily doped areas. The third via hole 271 and the fourth via hole 272 penetrate through the second active layer 32 and other film layers and extend to a surface of the first active layer 31, at this time, the third via hole 271 and the fourth via hole 272 may be obtained through a single photomask process, thereby simplifying the fabrication processes.

In the embodiment of the present disclosure, the source electrode 201 is provided in the third via hole 271, and the drain electrode 202 is further provided in the fourth via hole 272. The source electrode 201 is arranged in a corresponding via hole of the second active layer and extends to the surface of the first active layer 31, and the drain electrode 202 is arranged in a corresponding via hole of the second active layer and extends to the first active layer 31.

Furthermore, in the embodiment of the present disclosure, the source electrode 201 and the drain electrode 202 are directly disposed on a surface of the second active layer 32. The source electrode 201 and the drain electrode 202 are respectively and electrically connected to the first active layer 31 and the second active layer 32 through the third via hole 271 and the fourth via hole 272, thereby realizing the parallel structure of the first active layer 31 and the second active layer 32.

In the embodiment of the present disclosure, the source electrode 201 and the drain electrode 202 are directly disposed on the surface of the second active layer 32, therefore, the source/drain metal layer and the active layer are in surface contact, and the contact surface is large. And the source/drain metal layer is directly disposed on the second active layer 32, so that an interlayer dielectric layer may be omitted. Therefore, the array substrate prepared in the embodiment of the present disclosure can effectively improve the connection stability between the source/drain metal layer and the active layer and the comprehensive performance of the device.

Figure 6:
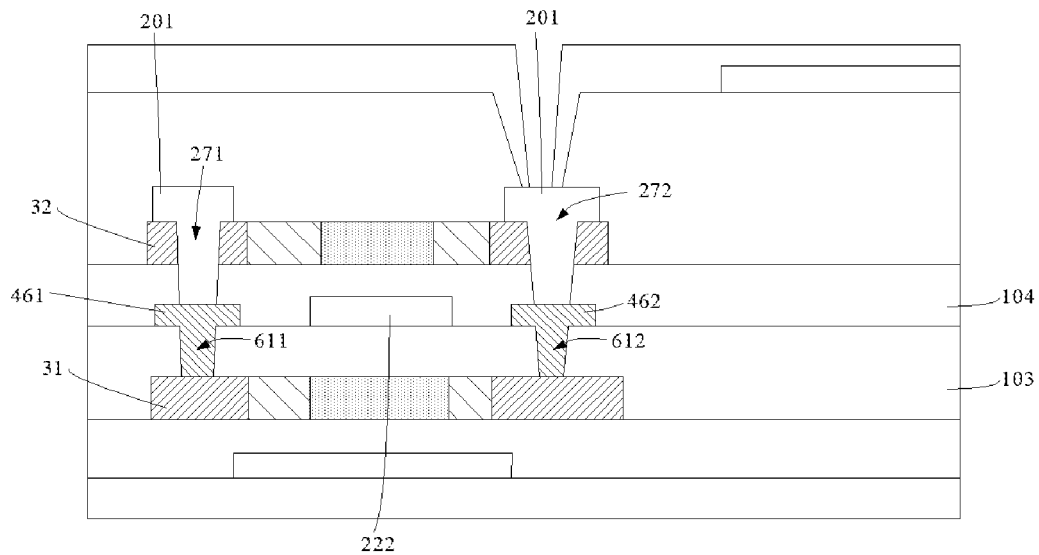
FIG. 6 is a schematic diagram of a film structure of a sixth array substrate provided in an embodiment of the present disclosure.
Figure 7:
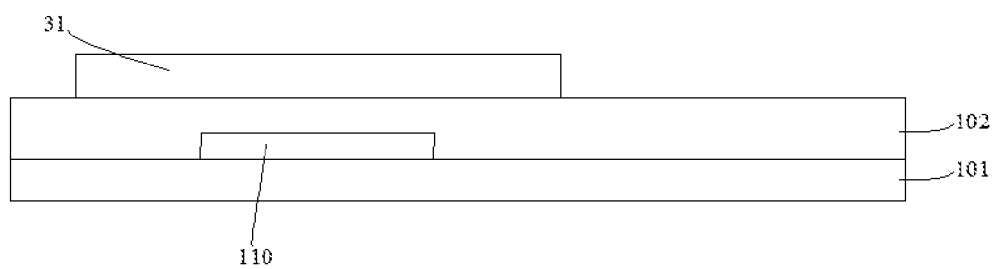
FIG. 7-FIG. 13 are schematic diagrams of corresponding film structures of the array substrate shown in FIG. 1 during different manufacturing processes.
Figure 8:
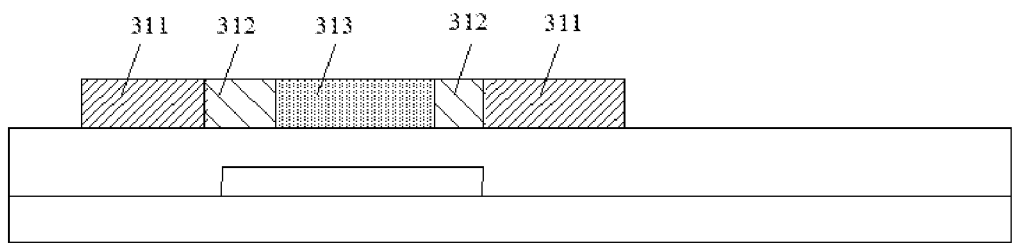

Furthermore, as shown in FIG. 6, FIG. 6 is a schematic diagram of a film structure of a sixth array substrate provided in an embodiment of the present disclosure. With reference to the film structure in the embodiment of FIG. 3, in the embodiment of the present disclosure, when the source/drain metal layer and the connection metal layer 46 are arranged, the source/drain metal layer is directly disposed on the second active layer 32, and the source electrode 201 and the drain electrode 202 are respectively disposed in the third via hole 271 and the fourth via hole 272.

In the embodiment of the present disclosure, the first connection metal layer 461, the second connection metal layer 462, and the gate electrode 222 may be fabricated in a same layer, thereby simplifying the fabrication processes. Preferably, materials of the first connection metal layer 461 and the second connection metal layer 462 may be same as a material of the gate electrode 222, and may be selected as Mo metal.

Furthermore, when via structures at corresponding positions are provided, the first gate insulating layer 103 is further provided with a fifth via hole 611 and a sixth via hole 612 penetrating the layer. Wherein the fifth via hole 611 and the sixth via hole 612 are arranged corresponding to the third via hole 271 and the fourth via hole 272. The first connection metal layer 461 is arranged in the fifth via hole 611 and electrically connected with the active layer 31, and the second connection metal layer 462 is disposed in the sixth via hole 612 and electrically connected to the first active layer 31.

With reference to the structure in FIG. 1, in this embodiment of the present disclosure, the connection metal layer and the via holes are provided in the film layers between the first active layer 31 and the second active layer 32, thereby reducing a depth of the via holes and simplifying the fabrication processes. At the same time, the performance of the via holes inside the device and the connection stability between the devices are also effectively improved.

At this time, a corresponding source/drain metal layer and the connection metal layer in the first gate insulating layer 103 and the second gate insulating layer 104 cause the first active layer and the second active layer to form the parallel structure.

Furthermore, in the embodiment of the present disclosure, in order to reduce a thickness of a formed display panel as much as possible when setting the above-mentioned film layer structures, a thickness of the first active layer 31 and a thickness of the second active layer 32 are set to 400 Å-500 Å. At the same time, a thickness of the first gate insulating layer 103 and a thickness of the second gate insulating layer 104 are set to 1000 Å-1500 Å, and corresponding materials may be insulating materials such as $SiO_x$. And a thickness of the interlayer insulating layer 105 is set to 5000 Å-7000 Å, and a corresponding material may be at least one of $SiO_x$ and $SiN_x$. Or, the thicknesses and materials are set according to specifications of an actual product, which will not be repeated here.

Preferably, the embodiments of the present disclosure further provide a manufacturing method of the array substrate. In the following embodiments, manufacturing processes corresponding to the film structure provided in FIG. 1 are used as an example for description. As shown in FIG. 7-FIG. 13, FIG. 7-FIG. 13 are schematic diagrams of corresponding films of the array substrate shown in FIG. 1 during different manufacturing processes.

Specifically, a substrate 101 is provided first, and a light shielding layer 110 is prepared on the substrate 101. At the same time, a buffer layer 102 is prepared on the light shielding layer 110. And a semiconductor layer is prepared on the buffer layer 102.

After preparation is completed, the semiconductor layer is subjected to a conducting treatment to form heavily doped areas 311, lightly doped areas 312, and a first channel area 313. In the embodiment of the present disclosure, the first channel area 313 may correspond to a polysilicon layer doped with ions, and the first active layer 31 in the embodiment of the present disclosure is formed.

Figure 9:
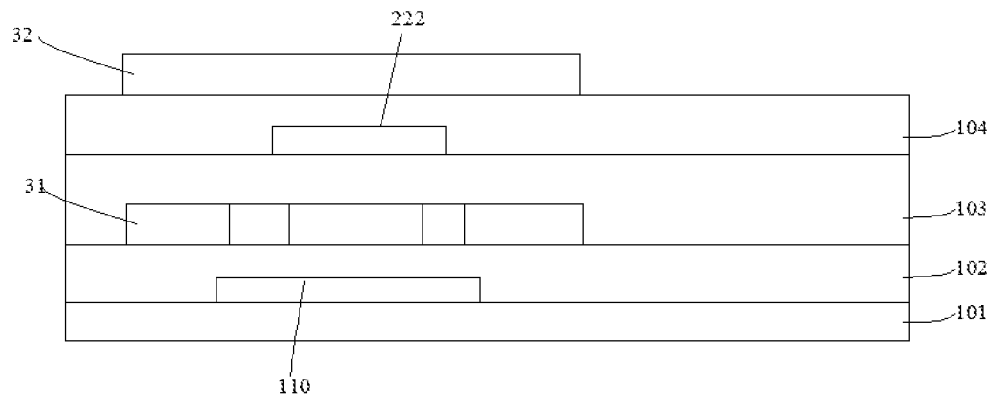

Referring to FIG. 9 for details, after the first active layer 31 is prepared, a first gate insulating layer 103 is prepared on the first active layer 31. At the same time, a gate electrode 222 is prepared on the first gate insulating layer 103, and a second gate insulating layer 104 is formed on the gate electrode 222. In the embodiment of the present disclosure, the first gate insulating layer 103 completely covers the first active layer 31, and the second gate insulating layer 104 completely covers the gate electrode 222. And the second active layer 32 is prepared on the second gate insulating layer 104.

In the embodiment of the present disclosure, the light shielding layer 110, the first active layer 31, the second active layer 32, and the gate electrode 222 may be arranged correspondingly, that is, the above film layers may be arranged in a same vertical plane. And a length of the light shielding layer 110 is greater than a total of a length of the first channel area 313 and lengths of the lightly doped areas 312 of the first active layer 31. At the same time, a material of the light shielding layer 110 may be same as a material of the connection metal layer, a material of the conductor layer, or a material of the source/drain metal layer.

Figure 10:
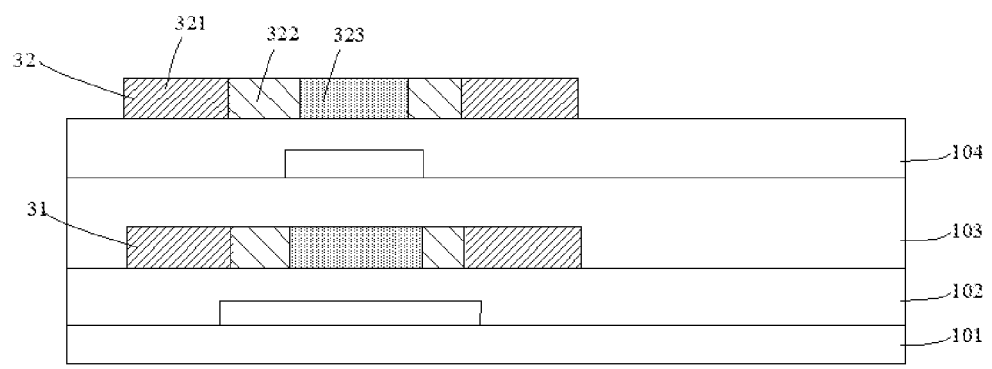

Referring to FIG. 10 for details, when forming the second active layer 32, a semiconductor layer is firstly prepared on the second gate insulating layer 104, and a treatment of ion-doping is performed on the semiconductor layer, and finally the second active layer 32 in the embodiment of the present disclosure is formed. Wherein the second active layer 32 also includes heavily doped areas 321, lightly doped areas 322, and a second channel area 323. In the embodiment of the present disclosure, the ion concentrations in the heavily doped areas 321 and the lightly doped areas 322 may be set according to actual products.

Figure 11:
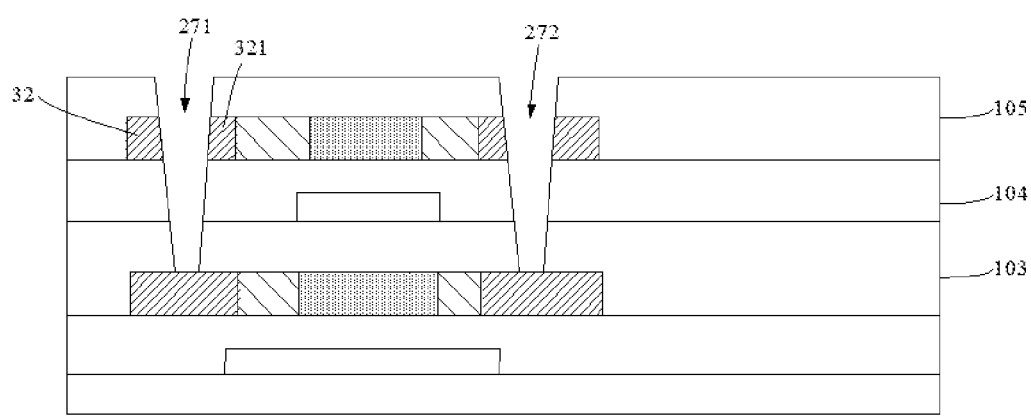

Referring to FIG. 11 for details, after preparation of the second active layer 32 is completed, a planarization layer 106 is prepared on the second active layer 32. In the embodiment of the present disclosure, the planarization layer 106 completely covers the second active layer 32. After preparation of the planarization layer 106 is completed, holes are defined at positions corresponding to the active layers of the thin film transistor.

Specifically, a third via hole 271 and a fourth via hole 272 are defined at positions corresponding to the first active layer 31 and the second active layer 32. At this time, the third via hole 271 penetrates the heavily doped area 321 of the second active layer 32, and simultaneously penetrates the planarization layer 106, the first gate insulating layer 103, and the second gate insulating layer 104, and makes a part of the first active layer 31 is exposed.

At this time, since depths of the third via hole 271 and the fourth via hole 272 are relatively deep, the etching may be performed by two etching processes. During a first etching process, the third via hole 271 is etched to a surface of the second gate insulating layer 104, and then during a second process, the surface of the second gate insulating layer 104 is etched to the surface of the first active layer 31, and finally the via structures provided in the embodiments of the present disclosure are formed.

In the embodiment of the present disclosure, the through hole in the second active layer 32 coincides with corresponding third via hole 271 or the fourth via hole 272. At the same time, an area of the through hole of the active layer 31 may be determined according to specifications of actual products. And during etching, the through hole is located in a central area of the heavily doped area.

Figure 12:
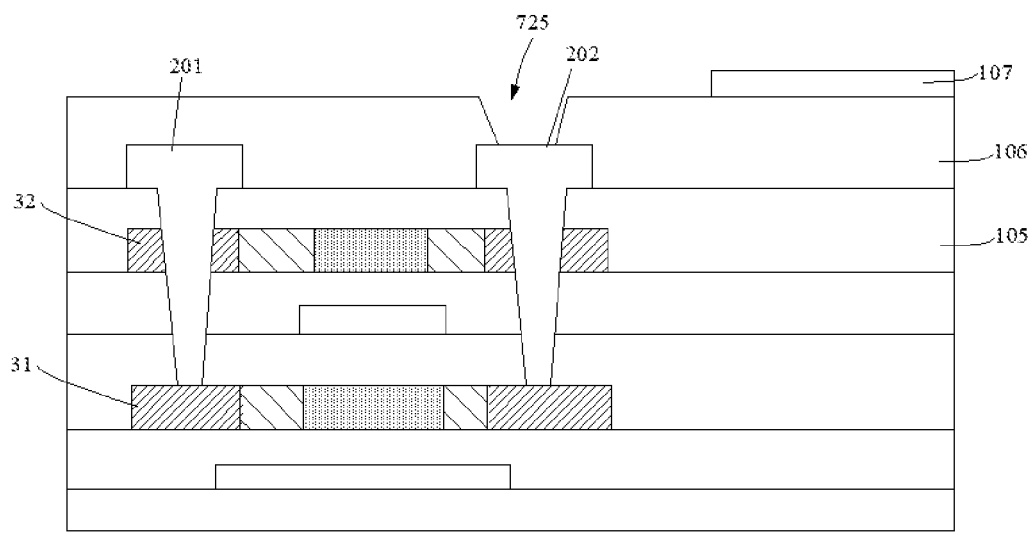

Referring to in FIG. 12 for detail, after the etching of the third via hole 271 and the fourth via hole 272 is completed, the source electrode 201 is prepared in the third via hole 271, and the drain electrode 202 is prepared in the fourth via hole 272 at the same time. And the source electrode 201 and the drain electrode 202 are electrically connected to the first active layer 31 and the second active layer 32.

After the source/drain metal layer is prepared, a planarization layer 106 is prepared on the interlayer insulating layer 105. At the same time, a via hole 725 is defined at a position of the planarization layer 106 corresponding to the drain electrode 202 through etching. A surface of the drain electrode 202 is exposed through the via hole 725. At the same time, a first electrode layer 107 is formed on the planarization layer 106.

Figure 13:
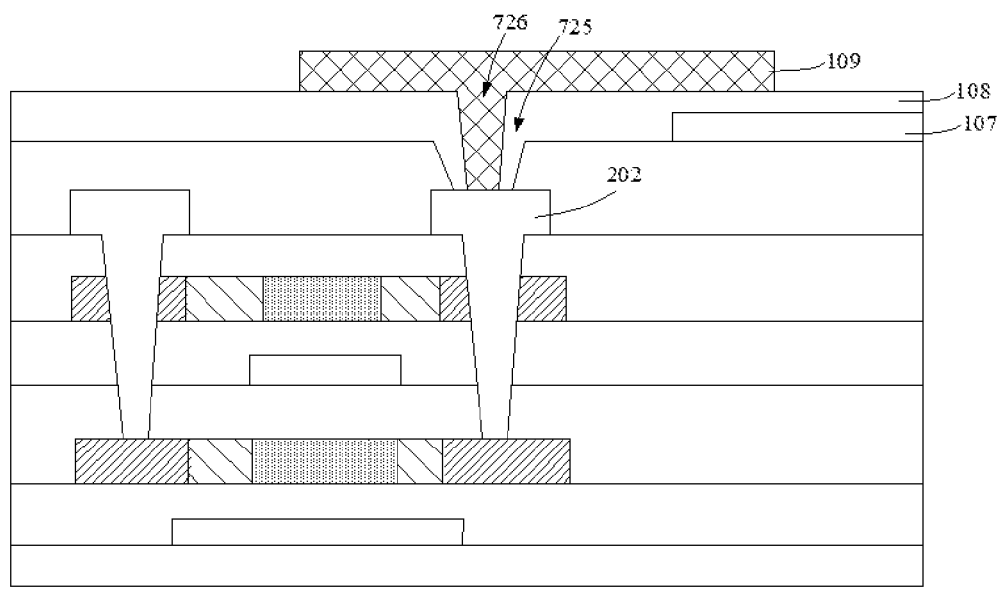

Referring to FIG. 13 for details, after the first electrode layer 107 is prepared, a passivation layer 108 is formed on the planarization layer 106, and the passivation layer 108 completely covers the first electrode layer 107.

At the same time, the passivation layer 108 is etched at a position corresponding to the via hole 725 to define a via hole 726. The via hole 726 is located in the via hole 725, and a diameter of the via hole 726 is less than a diameter of the via hole 725.

Then, a second electrode layer 109 is formed on the passivation layer 108, and the second electrode layer 109 fills the via hole 726 and is electrically connected to the drain electrode 202.

In the embodiments of the present disclosure, a stacked structure of two-layer active layers in parallel is formed through preparations. When the thin film transistor in the array substrate works normally, the parallel structure can effectively improve the on-state current in the device, and at the same time, further improve the mobility of the equivalent carriers of the device.

At the same time, in the array substrate provided in the embodiments of the present disclosure, the first active layer and the second active layer are arranged in a double-layer vertical structure, thereby effectively reducing a layout footprint of devices in the array substrate. In addition, when the array substrate and the corresponding display panel are prepared and formed, the preparations can be performed in an existing process technology, which can be compatible with the existing process technology. At the same time, the manufacturing method and processes provided in this disclosure are simpler, the comprehensive performance of the device can be further improved.

Furthermore, an embodiment of the present disclosure further provides a display panel. The display panel may include an array substrate and a pixel expression layer disposed on the array substrate. In the embodiment of the present disclosure, the pixel expression layer may include a liquid crystal layer, an organic light-emitting function layer, an electrophoretic layer, and other functional film layers. The pixel expression layer is used to realize or assist in realizing a light-emitting display of the display panel. The thin film transistor of the display panel provided in the embodiment of the present disclosure adopts a double-layer parallel structure, thereby effectively improving a luminous efficiency and a comprehensive performance of the display panel.

Wherein, the display panel may be any product or component with display functions and touch functions, such as a mobile phone, a computer, an electronic paper, a monitor, a notebook computer, a digital photo frame, etc., and its specific type is not specifically limited.

In summary, the array substrate and the display panel provided by the embodiments of the present disclosure are described above in detail. Specific examples are used in this paper to illustrate the principles and implementations of the present invention. The description is merely used to help understand the technical solutions and the core ideas of the present invention; although the present invention is disclosed as above in preferred embodiments, the above-mentioned preferred embodiments are not intended to limit the present disclosure. Those of ordinary skills in the art, without departing from the spirit and scope of the present disclosure, various changes and modifications can be made, so the protection scope of the present disclosure is subject to the scope defined by the claims.

What is claimed is:

1. An array substrate, comprising:
    a substrate;
    a first active layer, disposed on the substrate, the first active layer comprising a first channel area and first doped areas located at two sides of the first channel area;
    a gate electrode, disposed on the first active layer;
    a gate insulating layer, disposed on the first active layer and covering the gate electrode;
    a second active layer, disposed on the gate insulating layer, the second active layer comprising a second channel area and second doped areas located at two sides of the second channel area; and
    a source/drain metal layer, disposed on the second active layer;
    wherein the first doped areas are arranged corresponding to the second doped areas, the source/drain metal layer is electrically connected with the second doped areas, and parts of the first active layer in the first doped areas are correspondingly and electrically connected with parts of the second active layer in the second doped areas; and
    wherein a length of the first channel area is greater than a length of the second channel area.

2. The array substrate according to claim 1, wherein a length of an orthographic projection of the second doped areas on the substrate is greater than a length of an orthographic projection of the first doped areas on the substrate.

3. The array substrate according to claim 1, wherein the first doped areas and the second doped areas all comprise heavily doped areas and lightly doped areas, the lightly doped areas and the heavily doped areas are adjacent, and the heavily doped areas are disposed away from the first channel area or the second channel area;
    wherein the heavily doped areas of the first active layer correspond to the heavily doped areas of the second active layer, the lightly doped areas of the first active layer correspond to the lightly doped areas of the second active layer, and the source/drain metal layer is electrically connected with parts of the second active layer corresponding to the heavily doped areas.

4. An array substrate, comprising:
    a substrate;
    a first active layer, disposed on the substrate, the first active layer comprising a first channel area and first doped areas located at two sides of the first channel area;
    a gate electrode, disposed on the first active layer;
    a gate insulating layer, disposed on the first active layer and covering the gate electrode;
    a second active layer, disposed on the gate insulating layer, the second active layer comprising a second channel area and second doped areas located at two sides of the second channel area; and
    a source/drain metal layer, disposed on the second active layer;
    wherein the first doped areas are arranged corresponding to the second doped areas, the source/drain metal layer is electrically connected with the second doped areas, and parts of the first active layer in the first doped areas are correspondingly and electrically connected with parts of the second active layer in the second doped areas;
    wherein the first doped areas and the second doped areas all comprise heavily doped areas and lightly doped areas, the lightly doped areas and the heavily doped areas are adjacent, and the heavily doped areas are disposed away from the first channel area or the second channel area; and
    wherein the heavily doped areas of the first active layer correspond to the heavily doped areas of the second active layer, the lightly doped areas of the first active layer correspond to the lightly doped areas of the second active layer, and the source/drain metal layer is electrically connected with parts of the second active layer corresponding to the heavily doped areas.

5. The array substrate according to claim 4, wherein a length of an orthographic projection of the second doped areas on the substrate is greater than a length of an orthographic projection of the first doped areas on the substrate.

6. The array substrate according to claim 4, wherein the array substrate further comprises a first via hole and a second via hole, the heavily doped areas of the first active layer are connected with the heavily doped areas of the second active layer through the first via hole and the second via hole.

7. The array substrate according to claim 6, wherein the array substrate further comprises a conductor layer, the conductor layer is disposed in the first via hole and the second via hole, and the first active layer is connected in parallel with the second active layer through the conductor layer.

8. The array substrate according to claim 7, wherein a material of the conductor layer is same as a material of the parts of the second active layer corresponding to the heavily doped areas.

9. The array substrate according to claim 4, wherein the array substrate further comprises a third via hole and a fourth via hole, the source/drain metal layer is disposed on surfaces of the heavily doped areas of the second active layer, and the source/drain metal layer is electrically connected with the heavily doped areas of the first active layer through the third via hole and the fourth via hole.

10. The array substrate according to claim 9, wherein the third via hole and the fourth via hole pass through the heavily doped areas of the second active layer.

11. The array substrate according to claim 4, wherein the source/drain metal layer is disposed on upper surfaces of the heavily doped areas of the second active layer, and the source/drain metal layer is electrically connected with the second active layer and is electrically connected with the first active layer through corresponding via holes.

12. The array substrate according to claim 4, wherein the array substrate further comprises a connection metal layer, and the connection metal layer is disposed in corresponding film layers between the first active layer and the second active layer.

13. The array substrate according to claim 12, wherein the connection metal layer and the gate electrode are disposed in a same layer, and the connection metal layer is electrically connected to the source/drain metal layer and the heavily doped areas of the first active layer.

14. The array substrate according to claim 13, wherein a material of the connection metal layer is same as a material of the gate electrode.

15. The array substrate according to claim 4, wherein a length of the lightly doped areas of the first active layer is less than a length of the lightly doped areas of the second active layer.

16. The array substrate according to claim 4, wherein the first channel area and the second channel area are disposed corresponding to the gate electrode.

17. The array substrate according to claim 16, wherein an orthographic projection of the second channel area on the substrate is within an orthographic projection of the first channel area on the substrate.

18. The array substrate according to claim 4, wherein the array substrate further comprises a light shielding layer, the light shielding layer is disposed on the substrate, and the first active layer is disposed on the light shielding layer.

19. The array substrate according to claim 4, wherein a length of the first channel area is greater than or equal to a length of the second channel area.

20. A display panel, comprising:
   an array substrate; and
   a pixel expression layer, disposed on the array substrate;
   wherein at least two active layers are arranged in the array substrate, the active layers are connected in parallel, and the array substrate comprises:
   a substrate;
   a first active layer, disposed on the substrate, the first active layer comprising a first channel area and first doped areas located at two sides of the first channel;
   a gate electrode, disposed on the first active layer;
   a gate insulating layer, disposed on the first active layer and covering the gate electrode;
   a second active layer, disposed on the gate insulating layer, the second active layer comprising a second channel area and second doped areas located at two sides of the second channel area; and
   a source/drain metal layer, disposed on the second active layer;
   wherein the first doped areas are arranged corresponding to the second doped areas, the source/drain metal layer is electrically connected with the second doped areas, and parts of the first active layer in the first doped areas are correspondingly and electrically connected with parts of the second active layer in the second doped areas;
   wherein the first doped areas and the second doped areas all comprise heavily doped areas and lightly doped areas, the lightly doped areas and the heavily doped areas are adjacent, and the heavily doped areas are disposed away from the first channel area or the second channel area; and
   wherein the heavily doped areas of the first active layer correspond to the heavily doped areas of the second active layer, the lightly doped areas of the first active layer correspond to the lightly doped areas of the second active layer, and the source/drain metal layer is electrically connected with parts of the second active layer corresponding to the heavily doped areas.

* * * * *